United States Patent
Ree et al.

(10) Patent No.: US 9,003,063 B2
(45) Date of Patent: Apr. 7, 2015

(54) SYSTEMS, METHODS, AND APPARATUS FOR ESTIMATING POWER TIME OF USE

(75) Inventors: Bradley Richard Ree, Atlanta, GA (US); Steven Bietz, Atlanta, GA (US)

(73) Assignee: General Electric Company, Schenectady, NY (US)

( * ) Notice: Subject to any disclaimer, the term of this patent is extended or adjusted under 35 U.S.C. 154(b) by 128 days.

(21) Appl. No.: 13/297,612

(22) Filed: Nov. 16, 2011

(65) Prior Publication Data

US 2013/0124758 A1    May 16, 2013

(51) Int. Cl.
| | |
|---|---|
| G06F 15/16 | (2006.01) |
| G01R 22/06 | (2006.01) |
| G01D 4/00 | (2006.01) |
| G01R 21/133 | (2006.01) |

(52) U.S. Cl.
CPC .............. *G01R 22/063* (2013.01); *G01D 4/002* (2013.01); *G01R 21/133* (2013.01); *Y02B 90/245* (2013.01); *Y02B 90/241* (2013.01); *Y04S 20/32* (2013.01); *Y04S 20/40* (2013.01)

(58) Field of Classification Search
None
See application file for complete search history.

(56) References Cited

U.S. PATENT DOCUMENTS

| | | | |
|---|---|---|---|
| 6,704,329 B2 * | 3/2004 | Martin | 370/516 |
| 7,236,908 B2 | 6/2007 | Timko et al. | |
| 7,239,250 B2 | 7/2007 | Brian et al. | |
| 7,801,647 B2 * | 9/2010 | Fickey et al. | 700/291 |
| 7,924,964 B2 * | 4/2011 | Tseng et al. | 375/373 |
| 2005/0119841 A1 * | 6/2005 | Martin | 702/61 |
| 2006/0224335 A1 * | 10/2006 | Borleske et al. | 702/62 |
| 2012/0126995 A1 * | 5/2012 | Sobotka et al. | 340/870.03 |

OTHER PUBLICATIONS

Decision on Appeal for U.S. Appl. No. 10/984,546 mailed Feb. 17, 2011 (22 pgs.).

* cited by examiner

*Primary Examiner* — Kaveh Abrishamkar
*Assistant Examiner* — Janusz Kusyk
(74) *Attorney, Agent, or Firm* — Sutherland Asbill & Brennan LLP

(57) ABSTRACT

Certain embodiments of the invention may include systems, methods, and apparatus for estimating power time of use. According to an example embodiment of the invention, a method is provided for synchronizing local system time with a network clock for estimating power time of use. The method includes storing power usage data and initial time stamps, wherein the initial time stamps are derived from one or more of a local clock or broadcast network time; receiving data comprising network time; adjusting the local system time with a PID loop, wherein the PID loop adjusts the local system time based at least in part on a difference between the local clock and the received network time; storing, with the power usage data and initial time stamps, an indicator when the difference is greater than a predetermined value; and determining synchronization when the difference is less than or equal to a predetermined value.

17 Claims, 5 Drawing Sheets

SYSTEMS, METHODS, AND APPARATUS FOR ESTIMATING POWER TIME OF USE

FIELD OF THE INVENTION

This invention generally relates to electrical power distribution, and in particular, to estimating power time of use.

BACKGROUND OF THE INVENTION

Power meters are utilized by utility companies to measure customer power usage, primarily for billing purposes. Certain smart meters measure power usage over short time intervals, and can assign a time of use (or time stamp) to the power consumed over a given time interval. The time stamping can be used in tiered or dynamic pricing schedules, for example, to provide incentives for use during off-peak times, or to charge a premium for power consumption during peak hours.

Smart meters may receive periodic network clock synchronization signals to correct local clock errors. Many smart meters are equipped with a battery or a super capacitor to enable the meter's internal clock to continue running during a power loss so that when power is restored, the time of use stamps are approximately correct. However, such storage components add to the cost of the meter. After power loss and restoration, if the meter does not have a battery or super capacitor to keep the internal clock running, the meter may not be able to assign a correct time stamp to the usage data, and revenue may be lost by the utility during the time between power restoration and synchronization with the network time.

BRIEF SUMMARY OF THE INVENTION

Some or all of the above needs may be addressed by certain embodiments of the invention. Certain embodiments of the invention may include systems, methods, and apparatus for estimating power time of use.

According to an example embodiment of the invention, a method is provided for synchronizing local system time with a network clock for estimating power time of use. The method includes storing power usage data and initial time stamps, wherein the initial time stamps are derived from one or more of a local clock or broadcast network time; receiving data comprising network time; adjusting the local system time with a proportional, integral, and derivative (PID) loop, wherein the PID loop adjusts the local system time based at least in part on a difference between the local clock and the received network time; storing, with the power usage data and initial time stamps, an indicator when the difference is greater than a predetermined value; and determining synchronization when the difference is less than or equal to a predetermined value.

According to another example embodiment of the invention, a system for estimating power time of use is provided. The system includes a network clock; a local clock; a PID loop; at least one memory for storing data and computer-executable instructions; at least one processor configured to access the at least one memory, further configured to communicate with the network clock, local clock, and PID loop, and further configured to execute the computer-executable instructions for: storing power usage data and initial time stamps, wherein the initial time stamps are derived from one or more of the local clock or the network clock; receiving data comprising network time from the network clock by one or more networks; adjusting the local system time with the PID loop, wherein the PID loop adjusts the local system time based at least in part on a difference between the local clock and the received network time; storing, with the power usage data and initial time stamps, an indicator when the difference is greater than a predetermined value; and determining synchronization when the difference is less than or equal to a predetermined value.

According to another example embodiment, an apparatus for estimating power time of use is provided. The apparatus includes a local clock; a PID loop; at least one memory for storing data and computer-executable instructions; at least one processor configured to access the at least one memory, further configured to communicate with the local clock and PID loop, and further configured to execute the computer-executable instructions for: storing power usage data and initial time stamps, wherein the initial time stamps are derived from one or more of the local clock or a network clock; receiving data comprising network time from the network clock; adjusting the local system time with the PID loop, wherein the PID loop adjusts the local system time based at least in part on a difference between the local clock and the received network time; storing, with the power usage data and initial time stamps, an indicator when the difference is greater than a predetermined value; and determining synchronization when the difference is less than or equal to a predetermined value.

Other embodiments, features, and aspects of the invention are described in detail herein and are considered a part of the claimed inventions. Other embodiments, features, and aspects can be understood with reference to the following detailed description, accompanying drawings, and claims.

BRIEF DESCRIPTION OF THE FIGURES

Reference will now be made to the accompanying figures and flow diagrams, which are not necessarily drawn to scale, and wherein.

DETAILED DESCRIPTION OF THE INVENTION

Embodiments of the invention will be described more fully hereinafter with reference to the accompanying figures, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Certain embodiments of the invention may enable time of use (TOU) correction According to example embodiments, a local clock may be phase locked or synchronized to a network clock using a feedback loop. In an example embodiment, the synchronization may be accomplished with a proportional, integral, and derivative (PID) control loop. According to an example embodiment, power usage data may be sampled when the local power meter clock is running, even if the local clock is not synchronized to the network clock. According to an example embodiment, as network clock broadcast data is received by the local power meter or head end, the local time may eventually lock to the network time via the application of the PID control loop. According to an example embodiment, the PID control loop may adjust the local clock and/or set the system time based on the error or difference between the local clock and the received network clock data.

According to an example embodiment, samples captured may include a field that indicates if the local clock is synchronized or unlocked. In an example embodiment, once the local clock becomes synchronized with the network clock, previous samples may have their time stamps updated based on the synchronized local time. According to an example embodiment, new timestamps can be applied either in the meter or at the head end. Example embodiments may eliminate the need for a super capacitor or a battery in the meter.

Various systems, methods, and apparatus may be utilized for synchronizing time and estimating power time of use, according to example embodiments of the invention, and will now be described with reference to the accompanying figures.

Figure 1:
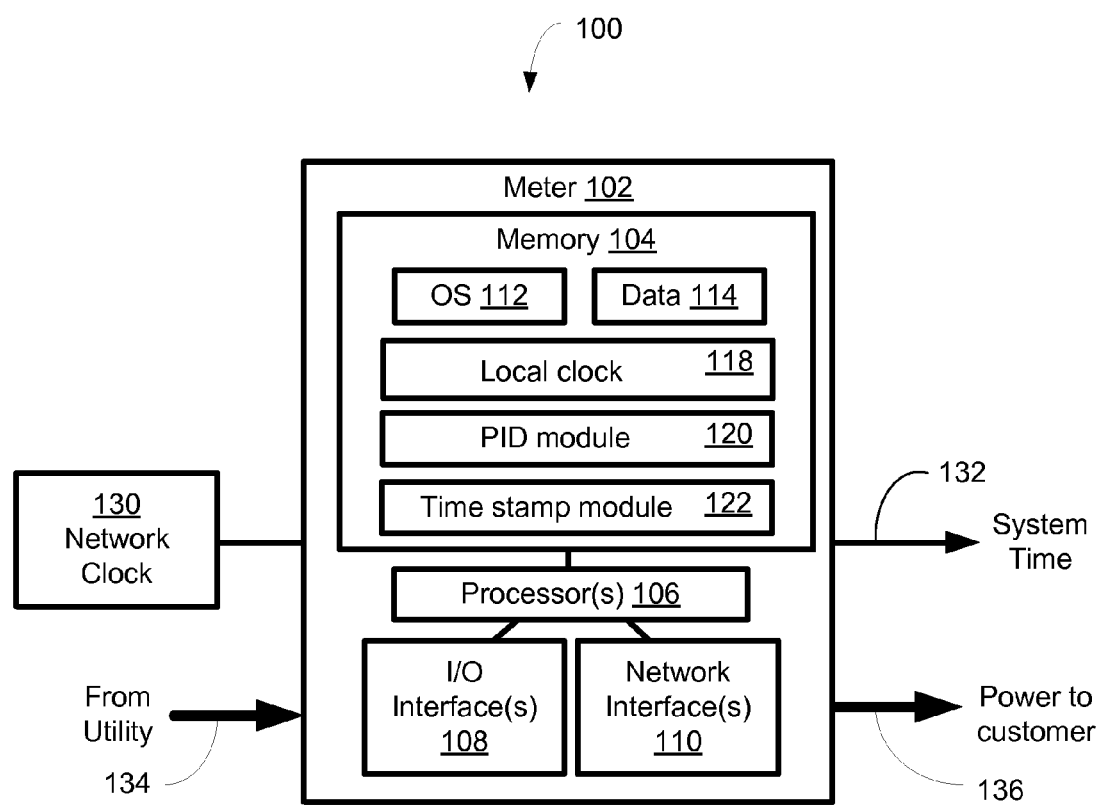
FIG. 1 is a block diagram of an illustrative power meter and time of use system according to an example embodiment of the invention.

FIG. 1 illustrates an example power meter and time of use system 100, according to an example embodiment of the invention. In an example embodiment, the system 100 includes a meter 102 having a memory 104, one or more processors 106, and one or more input/output (I/O) interfaces 108. In an example embodiment, the meter 102 may include a network interface 110. According to an example embodiment, the memory 104 may include an operating system (OS) 112 and data 114. In an example embodiment, the memory 104 may include a local clock 118 module, a PID module 120, and a time stamp module 122. According to an example embodiment, a network clock 130 may broadcast network time, and the network time may be received by the meter 102. In an example embodiment, the network clock 130 may broadcast time periodically, for example, every 30 minutes. In an example embodiment, the PID module 120 may receive data from the network clock 130 and the local clock 118, and the PID module 120 may be utilized for synchronizing the local clock 118 with the network clock 130. In an example embodiment, the meter 102 may also monitor usage data, for example, power received from the utility 134 and used by the customer 136. According to an example embodiment, system time 132 may be determined and may be associated with the usage data.

According to example embodiments, the time associated with the local clock 118 may be advanced in synchronization with the power being delivered from the utility 134. For example, power being delivered from the utility 134 may include a 60 Hz sinusoidal signal, and the local clock 118 may utilize this signal for operation.

Figure 2:
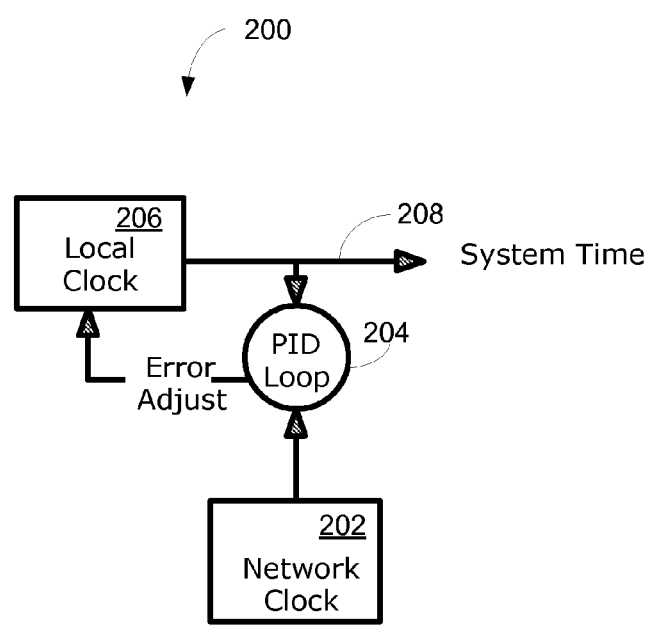
FIG. 2 is an illustrative example time correction feedback loop according to an example embodiment of the invention.

FIG. 2 depicts a time correction feedback loop 200 for determining system time 208 based on time received from a network clock 202. In an example embodiment, a PID loop 204 may receive network time from a network clock 202. The PID loop 204 may also receive local time from a local clock 206 and may determine an error based on the difference between the local time and the network time. In an example embodiment, the error may be utilized by the PID loop 204 to adjust the local clock 206 for producing the system time 208. According to example embodiments, the PID loop 204 can also be utilized to smooth out or reduce jitter associated with the network clock 202. For example, due to certain mesh network topologies, broadcast data from the network clock 202 may not always reliably arrive at the meter or head end with the same delay, and therefore, there may be some jitter error associated with the network clock 202. Example embodiments may utilize the PID loop 204 to reduce such error, and may also be utilized for bringing the system time 208 back in synchronization with the network clock 202 after a power failure.

Figure 3:
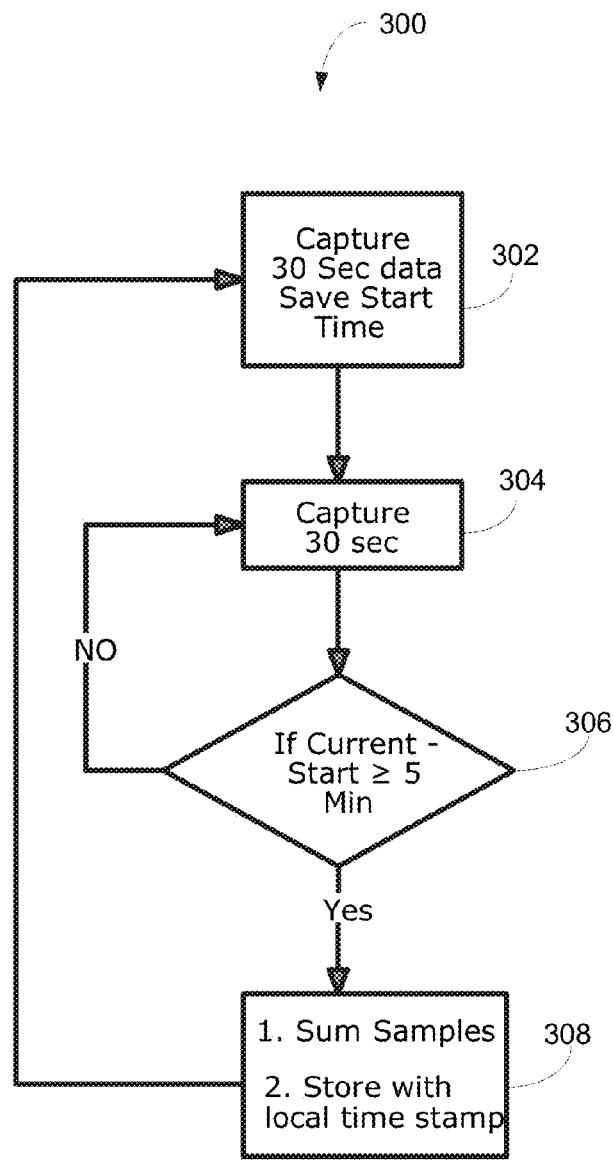
FIG. 3 is a time-stamp flow diagram according to an example embodiment of the invention.

FIG. 3 depicts an example time-stamp flow diagram 300, according to an example embodiment. According to an example embodiment, power usage data and corresponding time stamps may be sampled for a given time interval, then batch saved. According to an example embodiment, and in block 302, start time for the capture interval may be saved. In block 304, and according to an example embodiment, power usage data may be sampled and saved for a given time interval, for example, over a 30 second sample-time interval. In block 306, and according to an example embodiment, the start time and the current time may be compared. According to an example embodiment, if the current time minus the start time is less than a predetermined interval, for example 5 minutes, then an additional 30 seconds of data can be sampled and saved. According to an example embodiment, if the current time minus the start time is equal to or greater than a predetermined interval, for example greater than or equal to 5 minutes, then the flow diagram may invoke block 308 where the usage samples may be summed and stored with the local timestamp, and then the process can continue again from block 302 for the next time interval.

According to example embodiments, the time-stamp flow diagram 300 may also be utilized for detecting local time clock errors that may arise from a power outage, for example, if the current time minus the start time is negative, or greater than a predetermined interval, for example 6 minutes, then it may be likely that the local clock has become desynchronized at some point during the sampling process. According to an example embodiment, if the local time (or system time) is determined to be out of sync with the network time, recovery and synchronization may accomplished via the feedback control loop.

Figure 4:
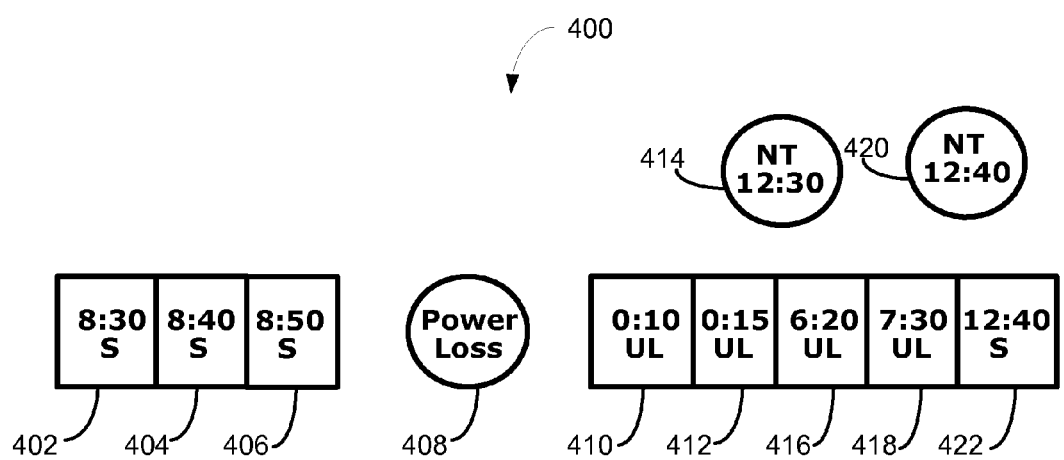
FIG. 4 is an example illustration of power loss and time recovery according to an example embodiment of the invention.

FIG. 4 depicts a power loss and time recovery illustration, according to an example embodiment of the invention. In this example illustration, a first sample 402 may be taken at 8:30, a second sample 404 may be taken at 8:40, and a third sample 406 may be taken at 8:50, each under synchronized system time. According to example embodiments of the invention, the system time may be derived or advanced based on frequency information received from the alternating current (AC) mains. In an example embodiment, and at some time after the third sample 406 is taken, power may be lost 408 for an unknown time. After power is restored, a fourth sample 410 may be taken, but since the power was lost, the local clock may output erroneous time, and the unlocked time stamp of 0:10 may be recorded for the sample. Subsequently, and according to this example illustration, a fifth sample 412 may be taken with an unlocked time stamp of 0:15 assigned to the sample. At 12:30, and according to this illustrative example, a first network time 414 may be received. Then the received network time 414 may be utilized via a PID loop to adjust the local clock and a sixth sample 416 may be taken, with an unlocked system time stamp of 6:20. A seventh sample 418 may be taken with an unlocked time stamp of 7:30. Then the meter may receive a second network time 420 at 12:40. According to an example, an eighth sample 422 may be taken and it may have a time stamp of 12:40. Accordingly, since the system time has been corrected to within a predetermined error of the network time by the PID loop, the eighth sample 422 may be labeled as synchronized.

According to an example embodiment, time stamps can be designated as synchronized or unlocked based on a predetermined error difference between the system time (or local clock) and the network time. According to an example embodiment, once time synchronization has been re-established after a power failure, the previously captured power samples that were designated as unlocked (for example, 410, 412, 416, and 418 of FIG. 4) can be back-filled or the associated time stamps may be modified based on the synchronized time and knowledge of the time elapsed between the unlocked samples.

Figure 5:
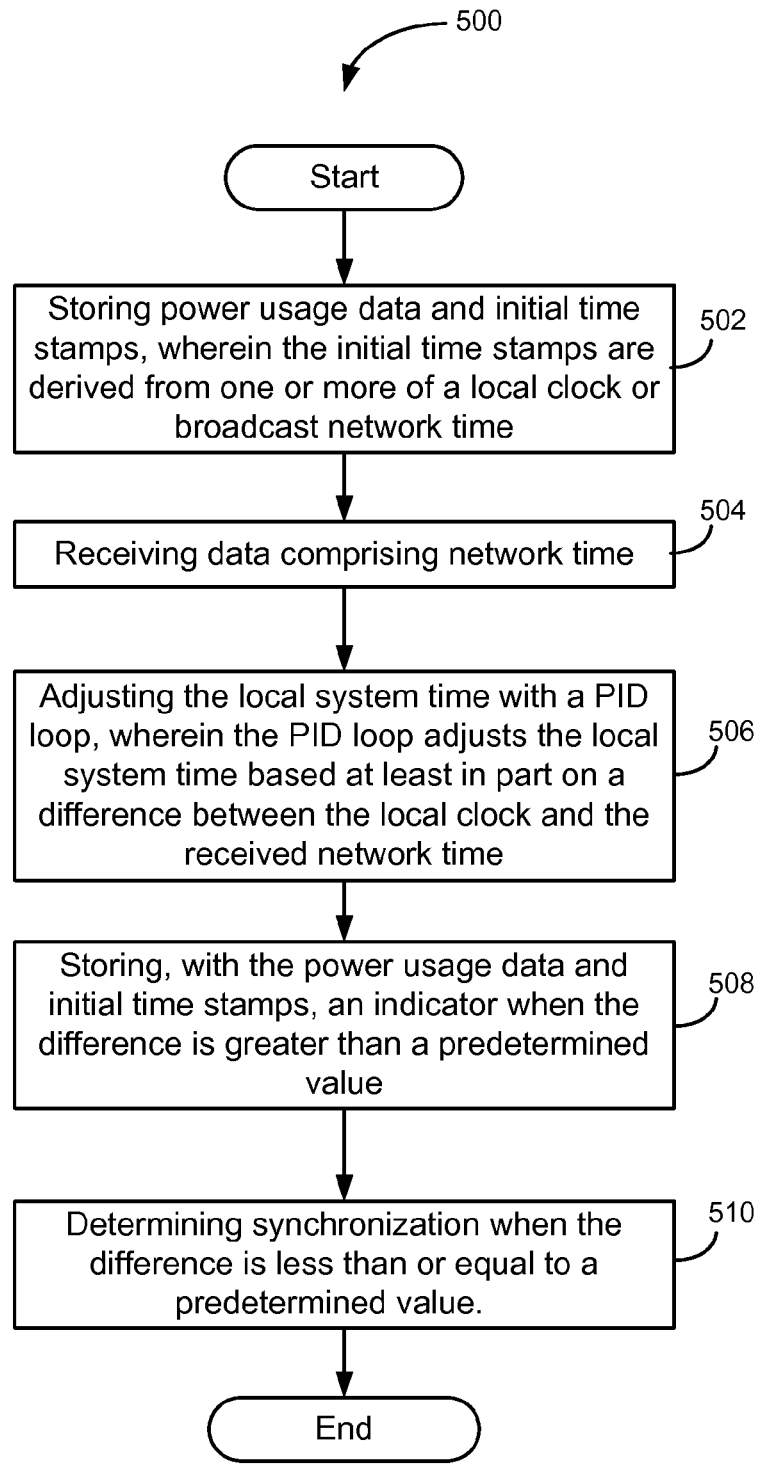
FIG. 5 is a flow diagram of an example method according to an example embodiment of the invention.

An example method 500 for synchronizing local system time with a network clock for estimating power time of use will now be described with reference to the flow diagram of FIG. 5. The method 500 starts in block 502, and according to an example embodiment of the invention includes storing power usage data and initial time stamps, wherein the initial time stamps are derived from one or more of a local clock or broadcast network time. In block 504, the method 500 includes receiving data comprising network time. In block 506, the method 500 includes adjusting the local system time with a PID loop, wherein the PID loop adjusts the local system time based at least in part on a difference between the local clock and the received network time. In block 508, the method 500 includes storing, with the power usage data and initial time stamps, an indicator when the difference is greater than a predetermined value. In block 510, the method 500 includes determining synchronization when the difference is less than or equal to a predetermined value. The method 500 ends after block 510.

Example embodiments further include revising one or more of the stored initial time stamps after power loss and restoration when synchronization is determined, and associating and storing revised time stamp values with the power usage data. In an example embodiment, revising includes retrieving one or more initial time stamps corresponding to the usage data; and calculating one or more revised time stamp values, wherein the revised time stamp values include the local system time minus a time associated with the initial time stamps.

According to an example embodiment, adjusting the local system time with the PID loop includes removing jitter from the received network time. According to an example embodiment, adjusting the local system time with the PID loop includes adjusting the local system time with one or more of proportional feedback, proportional and integral feedback, or proportional, integral, and derivative feedback. According to an example embodiment, time associated with the local clock is based at least in part on a signal associated with the power.

In an example embodiment, storing the power usage data includes integrating power usage over a first predetermined time period. According to an example embodiment, storing the power usage data and time stamps includes storing power usage data samples over a second predetermined time period greater than the first predetermined time period and associating the time stamps with the stored power usage data samples.

Example embodiments of the invention include a system and an apparatus. The system includes a network clock. The system and the apparatus include a local clock, a PID loop, at least one memory for storing data and computer-executable instructions and at least one processor configured to access the at least one memory. The at least one processor is further configured to communicate with a network clock, the local clock, and the PID loop, and further configured to execute the computer-executable instructions for: storing power usage data and initial time stamps, wherein the initial time stamps are derived from one or more of the local clock or the network clock; receiving data comprising network time from the network clock by one or more networks; adjusting the local system time with the PID loop, wherein the PID loop adjusts the local system time based at least in part on a difference between the local clock and the received network time; storing, with the power usage data and initial time stamps, an indicator when the difference is greater than a predetermined value; and determining synchronization when the difference is less than or equal to a predetermined value.

In an example embodiment, the at least one processor is further configured for revising one or more of the initial stored time stamps after power loss and restoration when synchronization is determined, and associating and storing revised time stamp values with the power usage data. In an example embodiment, the revising can include retrieving one or more initial time stamps corresponding to the usage data, and calculating one or more revised time stamp values, wherein the revised time stamp values include the local system time minus a time associated with the initial time stamps.

In an example embodiment, adjusting the local system time with the PID loop includes removing jitter from the received network time, wherein adjusting the local system time with the PID loop can include adjusting the local system time with one or more of proportional feedback, proportional and integral feedback, or proportional, integral, and derivative feedback.

In an example embodiment, the time associated with the local clock is based at least in part on a signal associated with the power. In an example embodiment, storing the power usage data can include integrating power usage over a first predetermined time period, wherein storing the power usage data and time stamps can include storing power usage data samples over a second predetermined time period greater than the first predetermined time period and associating the time stamps with the stored power usage data samples.

In an example embodiment, the synchronization may be accomplished with a proportional (P) control loop. In another example embodiment, the synchronization may be accomplished with a proportional and integral (PI) control loop. In another example embodiment, the synchronization may be accomplished with a proportional and derivative (PD) control loop.

According to example embodiments, certain technical effects can be provided, such as creating certain systems, methods, and apparatus for eliminating batteries, or energy storage capacitors in electrical meters. Example embodiments of the invention can provide the further technical effects of providing systems and methods for synchronizing system time with network time for time stamping power usage data.

In example embodiments of the invention, the power meter and time of use system 100 may include any number of hardware and/or software applications that are executed to facilitate any of the operations. In example embodiments, one or more I/O interfaces may facilitate communication between the power meter and time of use system 100 and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the power meter and time of use system 100. The one or more I/O interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the power meter and time of use system 100 inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth™ (owned by Telefonaktiebolaget LM Ericsson) enabled network, a Wi-Fi™ (owned by Wi-Fi Alliance) enabled network, a satellite-based network, any wired network, any wireless network, etc., for communication with external devices and/or systems. As desired, embodiments of the invention may include the power meter and time of use system 100 with more or less of the components illustrated in FIG. 1.

Certain embodiments of the invention are described above with reference to block and flow diagrams of systems and methods and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While certain embodiments of the invention have been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the invention, including the best mode, and also to enable any person skilled in the art to practice certain embodiments of the invention, including making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A method for estimating power time of use, the method comprising:
    storing power usage data and local time stamps;
    receiving data comprising network time;
    adjusting the local system time with a proportional, integral, and derivative (PID) loop, wherein the PID loop adjusts the local system time based at least in part on a difference between a local clock and the received network time;
    storing, with the power usage data and local time stamps, an indicator when the difference is greater than a predetermined error value;
    determining synchronization has occurred when the difference is less than or equal to a predetermined synchronization value; and
    revising one or more of the stored local time stamps after power loss and restoration when synchronization is determined, and associating and storing revised time stamp values with the power usage data, wherein revising comprises:
        retrieving one or more local time stamps corresponding to the usage data;
        detecting the power loss by subtracting a current time from a start time generating a resultant value;
        determining the power loss has occurred if the resultant value is negative;
        determining the power loss has occurred if the resultant value is greater than a predetermined interval; and
        calculating one or more revised time stamp values, wherein the revised time stamp values have been adjusted with the PID loop.

2. The method of claim 1, wherein adjusting the local system time with the PID loop comprises removing jitter from the received network time.

3. The method of claim 1, wherein adjusting the local system time with the PID loop comprises adjusting the local system time with one or more of proportional feedback, proportional and integral feedback, or proportional, integral, and derivative feedback.

4. The method of claim 1, wherein time associated with the local clock is based at least in part on a signal associated with the power.

5. The method of claim 1, wherein storing the power usage data comprises integrating power usage over a first predetermined time period.

6. The method of claim 5, wherein storing the power usage data and time stamps comprises storing power usage data samples over a second predetermined time period greater than the first predetermined time period and associating the time stamps with the stored power usage data samples.

7. A system for estimating power time of use, the system comprising:
- a network clock;
- a local clock;
- a proportional, integral, and derivative (PID) loop;
- at least one memory for storing data and computer-executable instructions;
- at least one processor configured to access the at least one memory, further configured to communicate with the network clock, the local clock, and the PID loop, and further configured to execute the computer-executable instructions for:
  - storing power usage data and local time stamps;
  - receiving data comprising network time from the network clock by one or more networks;
  - adjusting the local system time with the PID loop, wherein the PID loop adjusts the local system time based at least in part on a difference between the local clock and the received network time;
  - storing, with the power usage data and local time stamps, an indicator when the difference is greater than a predetermined error value;
  - determining synchronization has occurred when the difference is less than or equal to a predetermined synchronization value; and
  - revising one or more of the initial stored time stamps after power loss and restoration when synchronization is determined, and associating and storing revised time stamp values with the power usage data, wherein revising comprises:
    - retrieving one or more local time stamps corresponding to the usage data;
    - detecting the power loss by subtracting a current time from a start time generating a resultant value;
    - determining the power loss has occurred if the resultant value is negative;
    - determining the power loss has occurred if the resultant value is greater than a predetermined interval; and
    - calculating one or more revised time stamp values, wherein the revised time stamp values have been adjusted with the PID loop.

8. The system of claim 7, wherein adjusting the local system time with the PID loop comprises removing jitter from the received network time.

9. The system of claim 7, wherein adjusting the local system time with the PID loop comprises adjusting the local system time with one or more of proportional feedback, proportional and integral feedback, or proportional, integral, and derivative feedback.

10. The system of claim 7, wherein time associated with the local clock is based at least in part on a signal associated with the power.

11. The system of claim 7, wherein storing the power usage data comprises integrating power usage over a first predetermined time period.

12. The system of claim 11, wherein storing the power usage data and time stamps comprises storing power usage data samples over a second predetermined time period greater than the first predetermined time period and associating the time stamps with the stored power usage data samples.

13. An apparatus for estimating power time of use, the apparatus comprising:
- a local clock;
- a proportional, integral, and derivative (PID) loop;
- at least one memory for storing data and computer-executable instructions;
- at least one processor configured to access the at least one memory, further configured to communicate with the local clock and the PID loop, and further configured to execute the computer-executable instructions for:
  - storing power usage data and local time stamps;
  - receiving data comprising network time from the network clock;
  - adjusting the local system time with the PID loop, wherein the PID loop adjusts the local system time based at least in part on a difference between the local clock and the received network time;
  - storing, with the power usage data and local time stamps, an indicator when the difference is greater than a predetermined error value;
  - determining synchronization when the difference is less than or equal to a predetermined synchronization value; and
  revising one or more of the initial stored time stamps after power loss and restoration when synchronization is determined, and associating and storing revised time stamp values with the power usage data, wherein revising comprises:
    - retrieving one or more local time stamps corresponding to the usage data;
    - detecting the power loss by subtracting a current time from a start time generating a resultant value;
    - determining the power loss has occurred if the resultant value is negative;
    - determining the power loss has occurred if the resultant value is greater than a predetermined interval; and
    - calculating one or more revised time stamp values, wherein the revised time stamp values have been adjusted with the PID loop.

14. The apparatus of claim 13, wherein adjusting the local system time with the PID loop comprises removing jitter from the received network time.

15. The apparatus of claim 13, wherein time associated with the local clock is based at least in part on a 60 Hz signal associated with the power.

16. The apparatus of claim 13, wherein storing the power usage data comprises integrating power usage over a first predetermined time period.

17. The apparatus of claim 16, wherein storing the power usage data and time stamps comprises storing power usage data samples over a second predetermined time period greater than the first predetermined time period and associating the time stamps with the stored power usage data samples.

* * * * *